(12) United States Patent
Chuang et al.

(10) Patent No.: US 7,047,146 B2
(45) Date of Patent: May 16, 2006

(54) METHOD FOR AUTOMATICALLY CALIBRATING THE FREQUENCY RANGE OF A PLL AND ASSOCIATED PLL CAPABLE OF AUTOMATIC CALIBRATION

(75) Inventors: Chao-Shi Chuang, Tainan Hsien (TW); Chung-Cheng Wang, Taipei Hsien (TW); Wen-Shih Lu, Taipei Hsien (TW)

(73) Assignee: Airoha Technology Corp, Hsin-Chu (TW)

( * ) Notice: Subject to any disclaimer, the term of this patent is extended or adjusted under 35 U.S.C. 154(b) by 83 days.

(21) Appl. No.: 10/707,519

(22) Filed: Dec. 19, 2003

(65) Prior Publication Data

US 2005/0137816 A1   Jun. 23, 2005

(51) Int. Cl.
*G01R 35/00* (2006.01)
*G06F 19/00* (2006.01)
(52) U.S. Cl. .................................. 702/106
(58) Field of Classification Search ............ 702/106; 331/11, 17; 327/156
See application file for complete search history.

(56) References Cited

U.S. PATENT DOCUMENTS

| | | | |
|---|---|---|---|
| 6,323,736 B1 * | 11/2001 | Jansson | 331/44 |
| 6,552,618 B1 * | 4/2003 | Nelson et al. | 331/11 |
| 6,741,109 B1 * | 5/2004 | Huang et al. | 327/156 |
| 6,778,024 B1 * | 8/2004 | Gupta et al. | 331/16 |
| 6,816,019 B1 * | 11/2004 | Delbo' et al. | 331/17 |
| 6,856,205 B1 * | 2/2005 | Groe et al. | 331/17 |
| 2002/0075080 A1 * | 6/2002 | Nelson et al. | 331/11 |
| 2003/0042985 A1 * | 3/2003 | Shibahara et al. | 331/17 |

\* cited by examiner

*Primary Examiner*—Michael Nghiem
*Assistant Examiner*—Aditya S. Bhat
(74) *Attorney, Agent, or Firm*—Winston Hsu

(57) ABSTRACT

A PLL includes a loop filter for accumulating charge to generate a loop-filter voltage and a VCO having a plurality of frequency ranges. The VCO receives the loop-filter voltage and generates an output signal having a frequency according to the loop-filter voltage and a currently selected VCO frequency range. During PLL calibration, the loop-filter is connected to a constant voltage source; the PLL feedback signal is synchronized with the reference signal; a linear search, a binary search, or a memory lookup is used to find a first and a second VCO frequency range; first and second time durations are measured for the time durations between the second rising edges of the reference signal and the PLL feedback signal for the two VCO frequency ranges, and the optimal VCO frequency range is determined by setting the VCO frequency range to be the VCO frequency range having the shortest measured time duration.

7 Claims, 12 Drawing Sheets

METHOD FOR AUTOMATICALLY CALIBRATING THE FREQUENCY RANGE OF A PLL AND ASSOCIATED PLL CAPABLE OF AUTOMATIC CALIBRATION

BACKGROUND OF INVENTION

1. Field of the Invention

The invention relates to phase locked loops (PLLs), and more particularly, to a method for automatically determining an optimal VCO frequency range in a PLL having a plurality of frequency ranges.

2. Description of the Prior Art

A phase lock loop (PLL) is a circuit that generates a periodic output signal that has a constant phase relationship with respect to a periodic input signal. PLLs are widely used in many types of measurement, microprocessor, and communication applications.

FIG. 1 shows a block diagram of a conventional charge-pump PLL 100 according to the prior art. The conventional charge-pump PLL includes a reference divider 102, a phase/frequency detector (PFD) 104, a charge pump 106, a loop filter 108, a voltage controlled oscillator 110, and a feedback divider 112. The PDF 104 compares the phase of a reference signal $F_{REF}$ (divided from an input signal $F_{IN}$) to the phase of a feedback signal $F_{FB}$ and generates an error signal: either an Up signal (when the reference signal $F_{REF}$ leads the feedback signal $F_{FB}$) or a Down signal (when the reference signal $F_{REF}$ lags the feedback signal $F_{FB}$). The pulse width of the error signal indicates the magnitude of the phase difference between the reference signal $F_{REF}$ and the feedback signal $F_{FB}$.

The charge pump 106 generates an amount of charge equivalent to the error signal (Up or Down) from the PFD 104. Depending on whether the error signal is an Up signal or a Down signal, the charge is either added to or subtracted from capacitors in the loop filter 108. For the purposes of this explanation, the loop filter 108 has a relatively simple design, consisting of an integrator formed by a first capacitor 114 in parallel with the series combination of a second capacitor 116 and a resistor 118, and a low-pass filter formed by the a second resistor 120 and a third capacitor 122. As such, the loop filter 108 operates as an integrator that accumulates the net charge from charge pump 106. Other, more-sophisticated loop filters are of course also possible. The resulting loop-filter voltage $V_{TUNE}$ is applied to the VCO 110. A voltage-controlled oscillator is a device that generates a periodic output signal ($F_{OSC}$ in FIG. 1), whose frequency is a function of the VCO input voltage ($V_{TUNE}$ in FIG. 1). In addition to being the output signal from PLL 100, the VCO output signal $F_{OSC}$ is used to generate the feedback signal $F_{FB}$ for the closed-loop PLL circuit.

If the frequency of the output signal $F_{OSC}$ is to be either a fraction or a multiple of the frequency of the input signal $F_{IN}$, optional input and feedback dividers (102 and 112) are placed in the input and feedback paths, respectively. If this is not required, the input and feedback dividers can both be considered to apply factors of 1 to the input and feedback signals, respectively.

Due to the effect of the feedback path in PLL 100, the steady-state output signal $F_{OSC}$ will have a fixed phase relationship with respect to the input signal $F_{IN}$. Unless some phase offset is purposely added, the phases of the input and output signals will be synchronized will minimal offset.

Voltage-controlled oscillators, such as the VCO 110 of FIG. 1, are devices that are often designed for a wide range of applications (e.g., signal frequencies from 40 KHz to 400 MHz). Such VCOs are normally designed with a number of frequency ranges (i.e., voltage in vs. frequency out), where each frequency range is only a fraction of the total operating range of the VCO. FIG. 2 shows a hypothetical set of eight frequency ranges for the VCO 110 in FIG. 1. A special digital control input $VCO_{CTRL}$ is used to select one of the frequency ranges. The process of selecting a VCO frequency range appropriate for a particular application is called calibration.

For low-noise PLL applications, it is important for the VCO 110 in FIG. 1 to have a relatively low gain. This implies that the slope of the curve formed by the selected VCO frequency range should be relatively low, such as those shown in FIG. 2. A particular PLL application may have a specific desired frequency or desired frequency range for the VCO. For example, in one application, the PLL may be needed to generate a nominal 100 MHz output signal. To achieve the desired PLL operations, the VCO is calibrated by selecting the appropriate frequency range (e.g., VCO= in FIG. 2) whose center frequency $F_{CTR}$ is close to the desired nominal PLL output frequency.

Under ideal circumstances, corresponding frequency ranges (i.e., those having the same digital control input value $VCO_{CTR}$) in all VCOs of the same design would have the same center frequencies and slopes. If this were true, for a particular PLL application, the same VCO frequency range could be selected for each and every PLL instance. However, in the real world, due to variations during device fabrication, the characteristics of the frequency ranges vary from VCO to VCO. For example, the curves for the frequency ranges shown in FIG. 2 could shift up or to the right, and even have differing slopes. Nor are they all necessarily linear. As a result, for some applications, the VCOs in different PLL instances may need to be calibrated with different digital control input values $VCO_{CTRL}$ to select the appropriate VCO frequency ranges for the desired output frequency.

Conventionally, each VCO is tested in the factory to characterize its set of frequency ranges and to pre-determine which digital control input values are appropriate for different desired output frequencies. When a particular VCO is selected for a particular application, such as PLL 100 of FIG. 1, the appropriate calibration setting (i.e., the particular digital control input value $VCT_{CTRL}$ that corresponds to the desired output frequency) is permanently burned into the device by blowing fuse links. This factory testing and hard-wiring of the VCO adds to the cost of manufacturing the PLL. It also limits the operating frequency range of each PLL to the permanently selected frequency range.

SUMMARY OF INVENTION

It is therefore a primary objective of the claimed invention to provide a method for automatically calibrating the frequency range of a phase lock loop (PLL), to solve the above-mentioned problems.

According to the claimed invention, a method is disclosed for calibrating the frequency range of a phase lock loop (PLL). The method comprises providing a loop filter for accumulating charge to generate a loop-filter voltage; providing a voltage controlled oscillator (VCO) having a plurality of operating frequency ranges, the VCO receiving the loop-filter voltage and generating an output signal according to the loop-filter voltage and a currently selected operating frequency range; connecting an input of the loop filter to a constant voltage; and selecting an optimal VCO operating frequency range by comparing the frequency of a PLL feedback signal for a plurality of the operating frequency ranges with the frequency of a reference signal, the PLL feedback signal being generated according to the VCO output signal.

Also according to the claimed invention, a method is disclosed for determining an optimal VCO frequency range in a PLL including a VCO having a plurality of frequency ranges. The method comprises finding a first frequency range and an adjacent second frequency range such that the frequency of a PLL feedback signal is faster than the frequency of the reference signal for the first frequency range, and the frequency of the PLL feedback signal is slower than the frequency of the reference signal for the second frequency range, wherein the PLL feedback signal corresponds to a VCO output signal; synchronizing the PLL feedback signal with the reference signal; measuring a first time duration being the time duration between the second rising edges of the reference signal and the PLL feedback signal for the first operating frequency range; and measuring a second time duration being the time duration between the second rising edges of the reference signal and the PLL feedback signal for the second operating frequency range. The optimal VCO operating frequency range is the first frequency operating range when the first time duration is shorter than the second time duration, otherwise the optimal VCO operating frequency range is the second frequency operating range when the second time duration is shorter than the first time duration.

Also according to the claimed invention, a phase lock loop (PLL) is disclosed comprising a loop filter for accumulating charge to generate a loop-filter voltage; a VCO having a plurality of frequency ranges, the VCO receiving the loop-filter voltage and generating an output signal according to the loop-filter voltage and a currently selected frequency range; and calibration logic for selecting an optimal VCO frequency range. During PLL calibration, the input of the loop filter is connected to a constant voltage, and the calibration logic searches for an optimal VCO frequency range by comparing the frequency of a PLL feedback signal for a plurality of the operating frequency ranges with the frequency of a reference signal, the PLL feedback signal being generated according to the VCO output signal.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
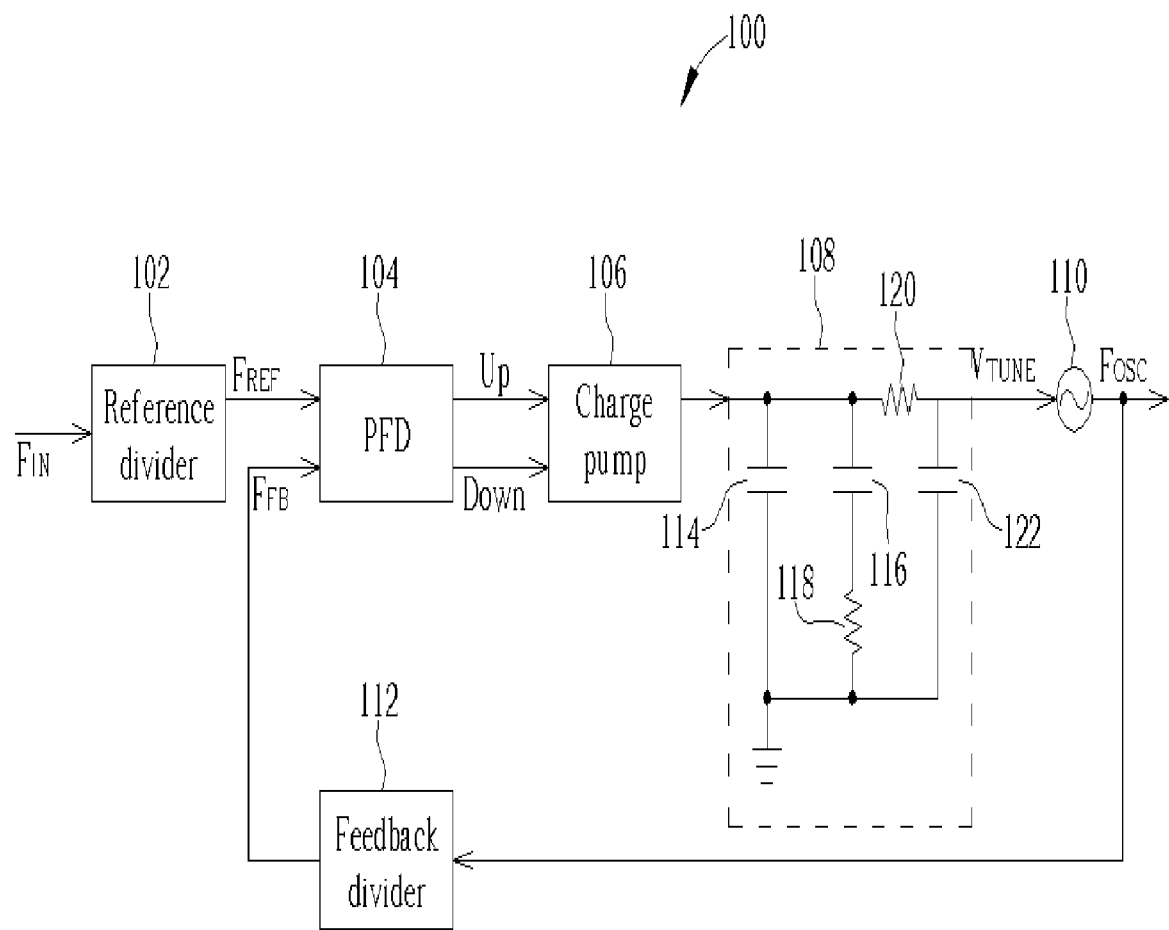
FIG. 1 is a block diagram of a conventional PLL according to the prior art.
Figure 2:
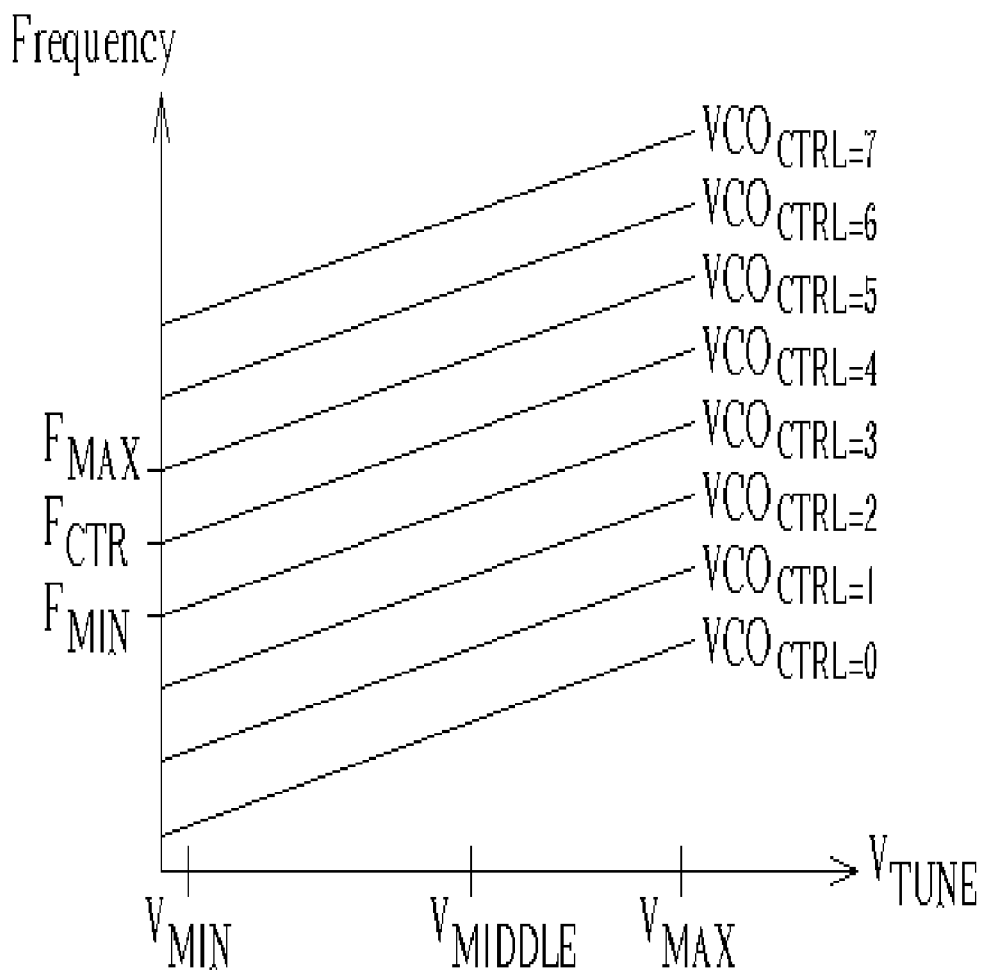
FIG. 2 is diagram showing a hypothetical set of eight frequency ranges for the VCO of FIG. 1.
Figure 3:
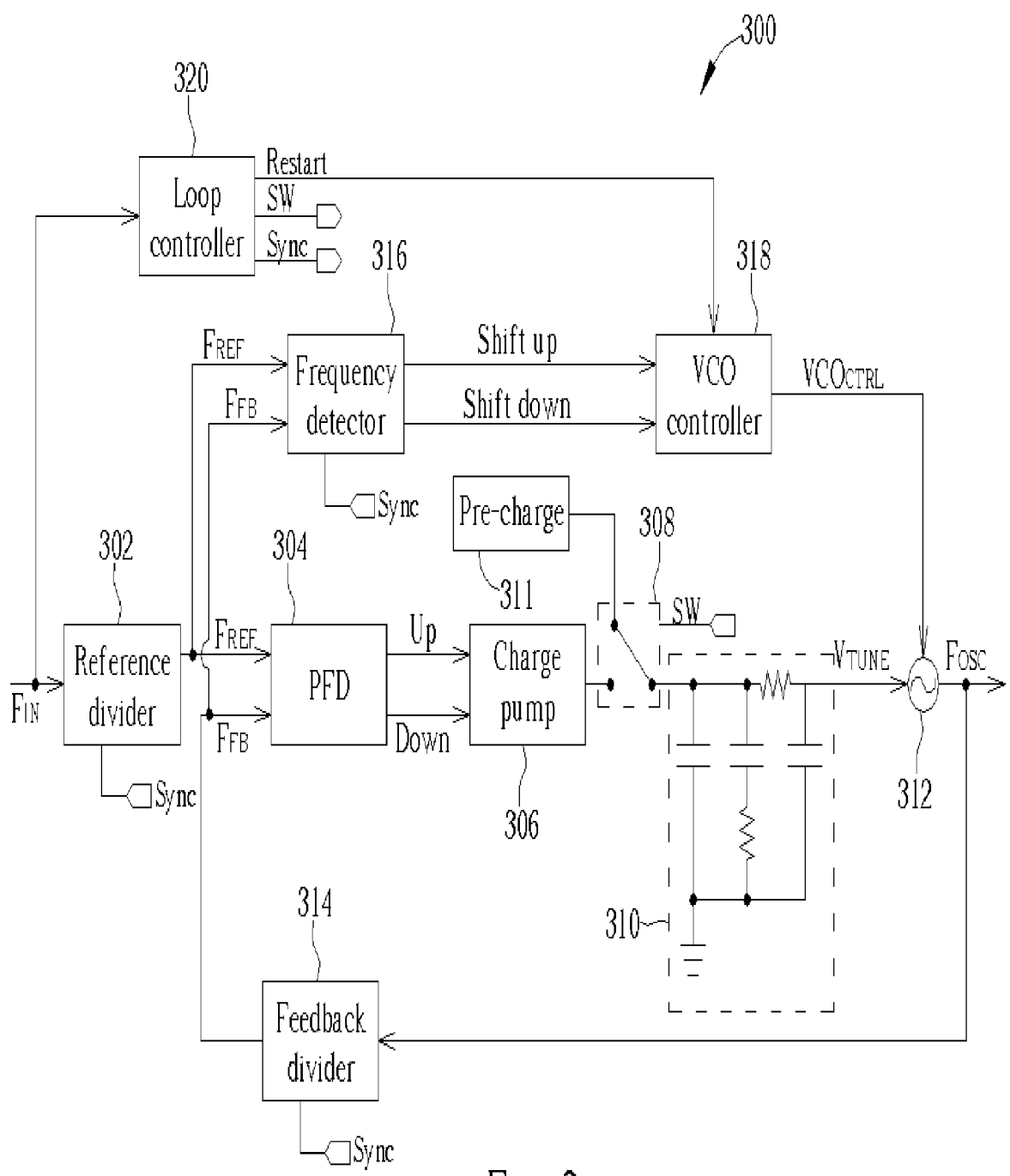
FIG. 3 is a block diagram of a PLL according to a first embodiment of the present invention.

FIG. 3 shows a block diagram a PLL 300 capable of automatic calibration according to a first embodiment of the present invention. The PLL 300 includes a reference divider 302, a phase/frequency detector (PFD) 304, a charge pump 306, a switch 308, a loop filter 310, a pre-charge unit 311, a voltage controlled oscillator 312, a feedback divider 314, a frequency detector 316, a VCO controller 318, and a loop controller 320. During normal PLL operations, the switch 308 connects the output of the charge pump 306 to the loop filter 310 and the operation of the reference divider 302, the PDF 304, the charge pump 306, the loop filter 310, the VCO 312, and the feedback divider 314 is the same as explained for FIG. 1. However, unlike the conventional PLL described in FIG. 1, when the PLL 300 is switched on, it uses a linear search to automatically calibrate the VCO frequency range, preventing the need to hardwire the frequency range during manufacturing, accounting for process variations, and allowing the PLL 300 to be used in a variety of different applications.

An automatic linear search calibration process according to the first embodiment of the present invention is described as follows. When the PLL 300 is powered on, the loop controller 320 issues a Restart signal to the VCO controller and switches the switch 308 to connect the pre-charge unit 311 to the loop filter 310. In the first embodiment of the present invention, the pre-charge unit pre-charges the loop filter 310 to a maximum voltage value $V_{MAX}$. The loop controller 320 waits a pre-charge time before continuing calibration to ensure the loop filter 310 is fully charged. For each VCO frequency range, the loop controller 320 issues a Sync pulse to the reference divider 302, the frequency detector 316, and the feedback divider 314. The Sync pulse is used to synchronize the feedback signal $F_{FB}$ with the reference signal $F_{REF}$. This aligns a first rising edge of the feedback signal $F_{FB}$ directly with a first rising edge of the reference signal $F_{REF}$. Because synchronizing is well known to a person skilled in the art, further description of the synchronizing mechanism is hereby omitted. The loop controller 320 issues the Sync pulses sequentially separated by a calibration time period. The calibration time period is long enough for the VCO controller 318 to determine the suitability of each VCO frequency range. When receiving the Restart signal, the VCO controller 318 configures the VCO 312 to use the lowest frequency range $VCO_{CTRL}=0$. After being synchronized, the frequency detector 316 compares the frequency of the reference signal $F_{REF}$ and the feedback signal $F_{FB}$. If the frequency of the feedback signal $F_{FB}$ is faster than the frequency of the reference signal $F_{REF}$, the frequency detector 316 asserts the "Shift Down" signal to indicate that the VCO 312 is running too quickly. Likewise, if the frequency of the feedback signal $F_{FB}$ is slower than the frequency of the reference signal $F_{REF}$, the frequency detector 316 asserts the "Shift Up" signal to indicate that the VCO 312 is running too slowly.

In the first iteration of the automatic calibration process, if the VCO controller 318 receives the "Shift Down" signal from the frequency detector 316, this means the reference signal $F_{REF}$ is somewhere in the lowest frequency range of the VCO. In this case, the VCO controller 318 continues to use the current VCO frequency range and calibration is finished. Although the loop controller 320 continues to issue Sync pulses for the remaining VCO frequency ranges, because calibration is finished, the VCO controller 318 does not need to further adjust the VCO frequency range. Alternatively, if the VCO controller 318 receives the "Shift Up" signal, this means the feedback signal $F_{FB}$ is too slow and the VCO controller 318 switches the VCO 312 to the next higher frequency range $VCO_{CTRL}=1$. The loop controller 318 issues a new Sync signal for the next VCO frequency range. The frequency detector 316 again compares the frequency of the reference signal $F_{REF}$ and the feedback signal $F_{FB}$. If the VCO controller 318 receives the "Shift Down" signal from the frequency detector 316, this means the reference signal $F_{REF}$ is somewhere in the current frequency range of the VCO. In this case, the VCO controller 318 continues to use the current VCO frequency range and calibration is finished. Alternatively, if the VCO controller 318 receives the "Shift Up" signal, this means the feedback signal is still too slow and the VCO controller 318 switches the VCO 312 to the next higher frequency range. The process is repeated until a VCO frequency range is found where the feedback signal $F_{FB}$ is faster than the reference signal $F_{REF}$.

Figure 4:
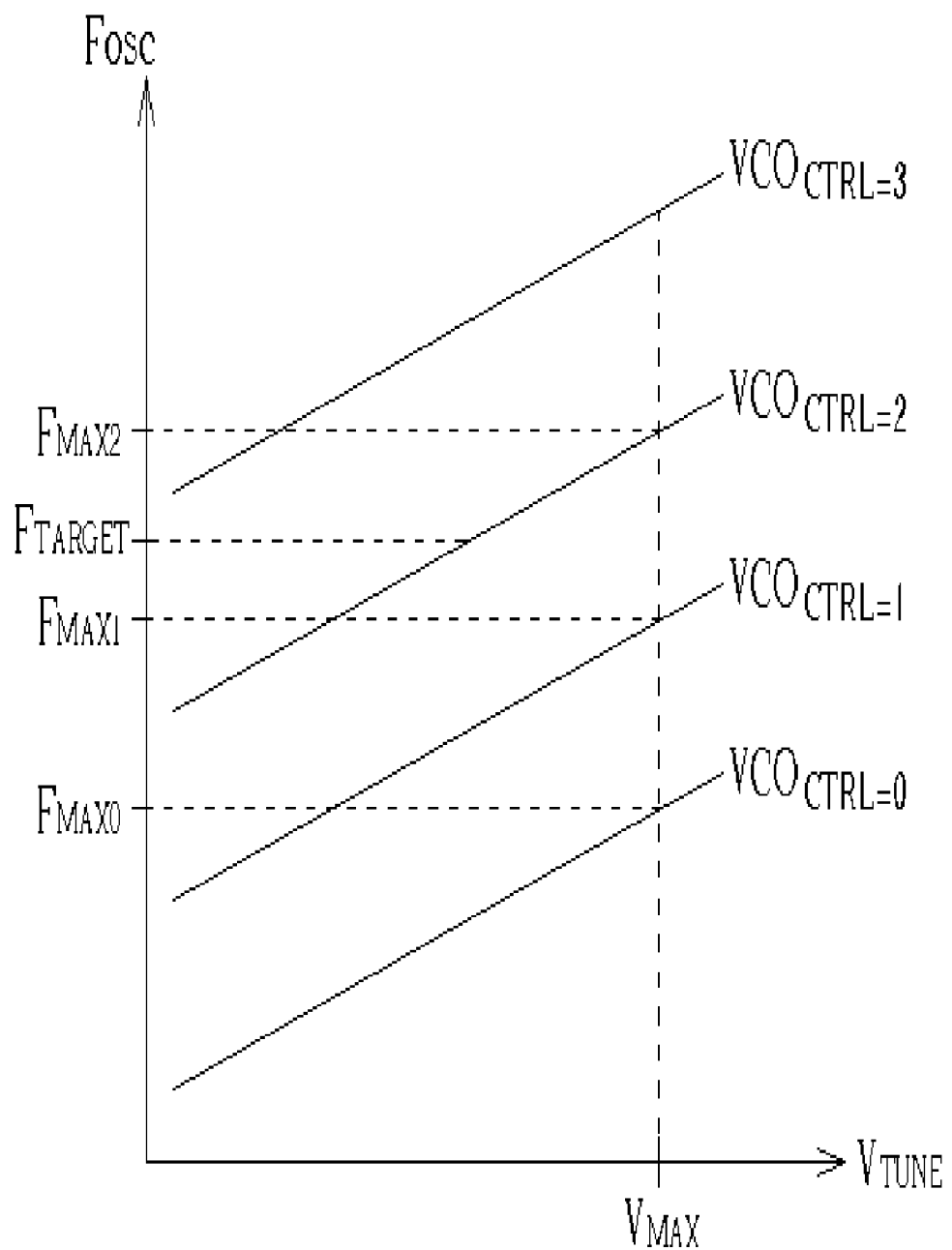
FIG. 4 is a diagram showing a hypothetical set of four frequency ranges for the VCO of FIG. 3.

FIG. 4 shows a hypothetical set of four frequency ranges for the VCO 312 of FIG. 3. As shown in FIG. 4, the VCO 312 has four frequency ranges, selected by setting $VCO_{CTRL}$ to 0, 1, 2, or 3 respectively. As an example, assume the input frequency $F_{IN}$ corresponds to a nominal target oscillator frequency of $F_{TARGET}$. When the PLL 300 is turned on, as described for FIG. 3, the loop controller 320 asserts the Restart signal, and switches the switch 308 to pre-charge the loop filter 310 to a maximum value $V_{MAX}$. Upon receiving the Restart signal, the VCO controller sets the VCO to the first VCO frequency range ($VCO_{CTRL}=0$). After the pre-charge time duration, when the loop-filter has been recharged to a maximum value ($V_{TUNE}=V_{MAX}$), the loop controller issues a Sync pulse to synchronize the $F_{FB}$ to the $F_{REF}$ signal. For the first VCO frequency range, $V_{MAX}$ corresponds to a VCO frequency of $F_{MAX0}$. The frequency detector 316 compares the feedback signal $F_{FB}$ (divided down from $F_{MAX0}$) with the reference signal $F_{REF}$ (divided down from $F_{IN}$). Because $F_{TARGET}$ is higher than $F_{MAX0}$, the frequency detector 316 asserts "Shift Up", indicating that the VCO is running too slowly. Upon receiving "Shift Up", the VCO controller 318 sets the VCO to the second VCO frequency range ($VCO_{CTRL}=1$), which corresponds to a VCO frequency of $F_{MAX1}$. The loop controller 320 asserts the next Sync pulse and the frequency detector 316 again compares the feedback signal $F_{FB}$ with the reference signal $F_{REF}$. Because $F_{TARGET}$ is higher than $F_{MAX1}$, the frequency detector 316 again asserts "Shift Up" and the VCO controller 318 sets the VCO to the third VCO frequency range ($VCO_{CTRL}=2$). This frequency range corresponds to a VCO frequency of $F_{MAX2}$. The loop controller 320 asserts the next Sync pulse and the frequency detector 316 again compares the feedback signal $F_{FB}$ with the reference signal $F_{REF}$. Because $F_{MAX2}$ is faster than $F_{TARGET}$, $F_{FB}$ is faster than $F_{REF}$ and the frequency detector 316 asserts "Shift Down", indicating that the VCO is now running too quickly. Receiving "Shift Down" means that the VCO has crossed from being too slow to being too fast. This means that $F_{TARGET}$ is now within the current VCO frequency range and the VCO controller 300 can therefore lock the current frequency range selection and end calibration. Although the loop controller 320 issues a Sync pulse for the remaining VCO frequency range, because calibration is finished, the VCO controller 318 does not need to further adjust the VCO frequency range. Once all VCO frequency range have been finished, the loop controller 320 switches the switch 308 to reconnect the charge pump 306 to the loop filter 310 and start normal PLL 300 operations.

Figure 5:
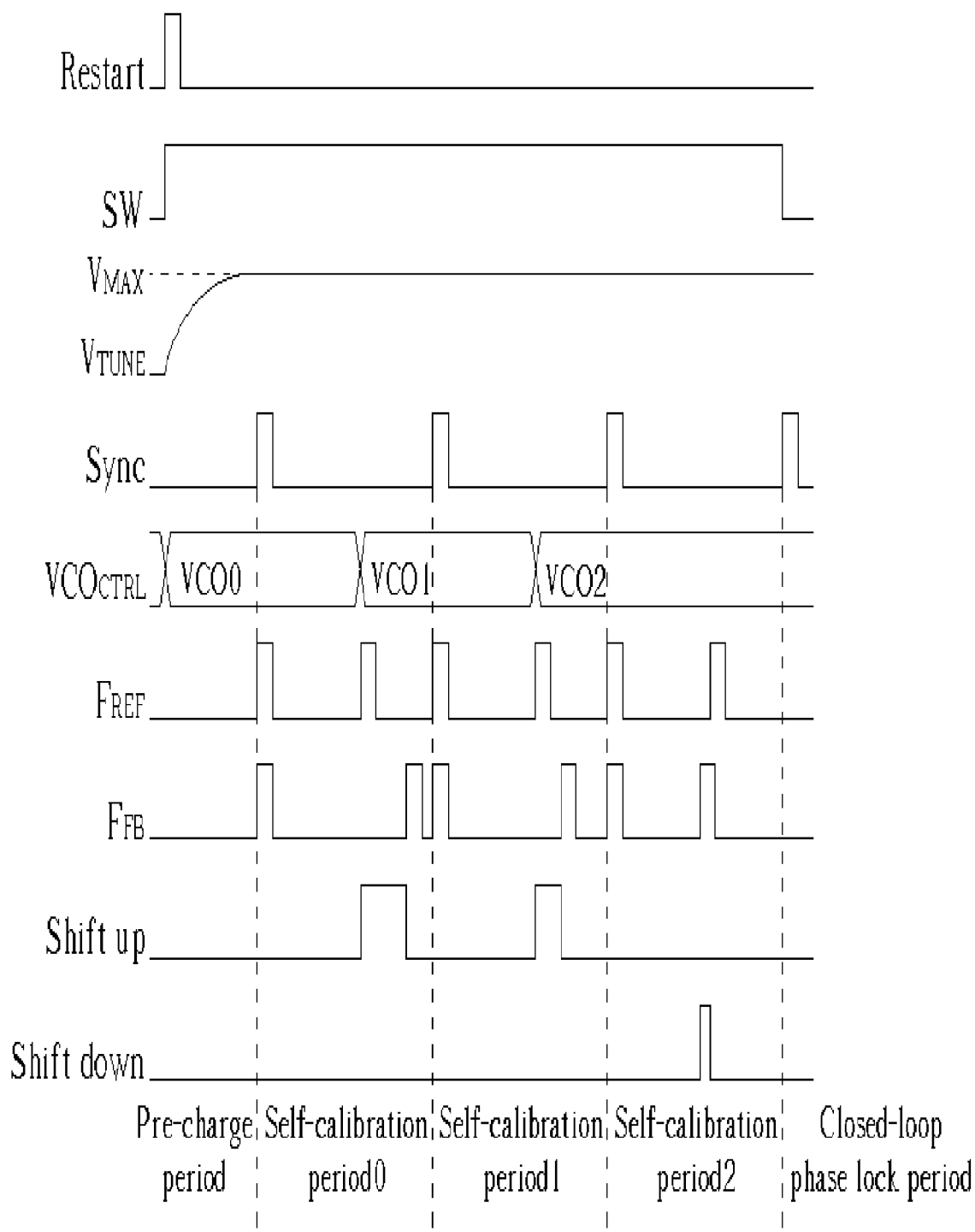
FIG. 5 is a timing diagram of the calibration signals for the PLL of FIG. 3.

FIG. 5 shows a timing diagram of the calibration signals of the PLL 300 shown in FIG. 3 having the frequency ranges shown in FIG. 4. To begin automatic calibration, the loop controller 320 asserts the Restart signal and switches the switch 308 to allow the pre-charge unit 311 to charge the loop filter 310 to a maximum voltage $V_{MAX}$. During the precharge period, the loop filter 310 output voltage $V_{TUNE}$ is charged to a maximum value $V_{MAX}$. For each VCO frequency range, the loop controller then asserts a Sync pulse to synchronize the first rising edges of the reference signal $F_{REF}$ and the feedback signal $F_{FB}$. If the second rising edge of the reference signal $F_{REF}$ leads the second rising edge of feedback signal $F_{FB}$, then the frequency 316 asserts "Shift Up". If the second rising edge of the reference signal $F_{REF}$ lags the second rising edge of feedback signal $F_{FB}$, then the frequency 316 asserts "Shift Down". When "Shift Down" is received by the VCO controller 318, as happens when $VCO_{CTRL}=2$ in FIG. 5, self-calibration is finished and the current VCO frequency range is used. After the last self-calibration phase, the loop controller switches the switch 308 back to the closed-loop position and normal PLL operations ensue.

It should be noted that although the first embodiment of the present invention has been described as a linear search from the lowest VCO frequency range to the highest VCO frequency range, the opposite search order is also acceptable. In the case of searching from highest VCO frequency range to lowest VCO frequency range, the pre-charge unit 311 should be configured to charge the loop filter 310 to a minimum voltage $V_{MIN}$. When the VCO controller 318 receives "Shift Up" from the frequency detector, this means the reference signal $F_{REF}$ is somewhere in the current frequency range of the VCO. In this case, the VCO controller 318 can continue to use the current VCO frequency range and calibration is finished.

Figure 6:
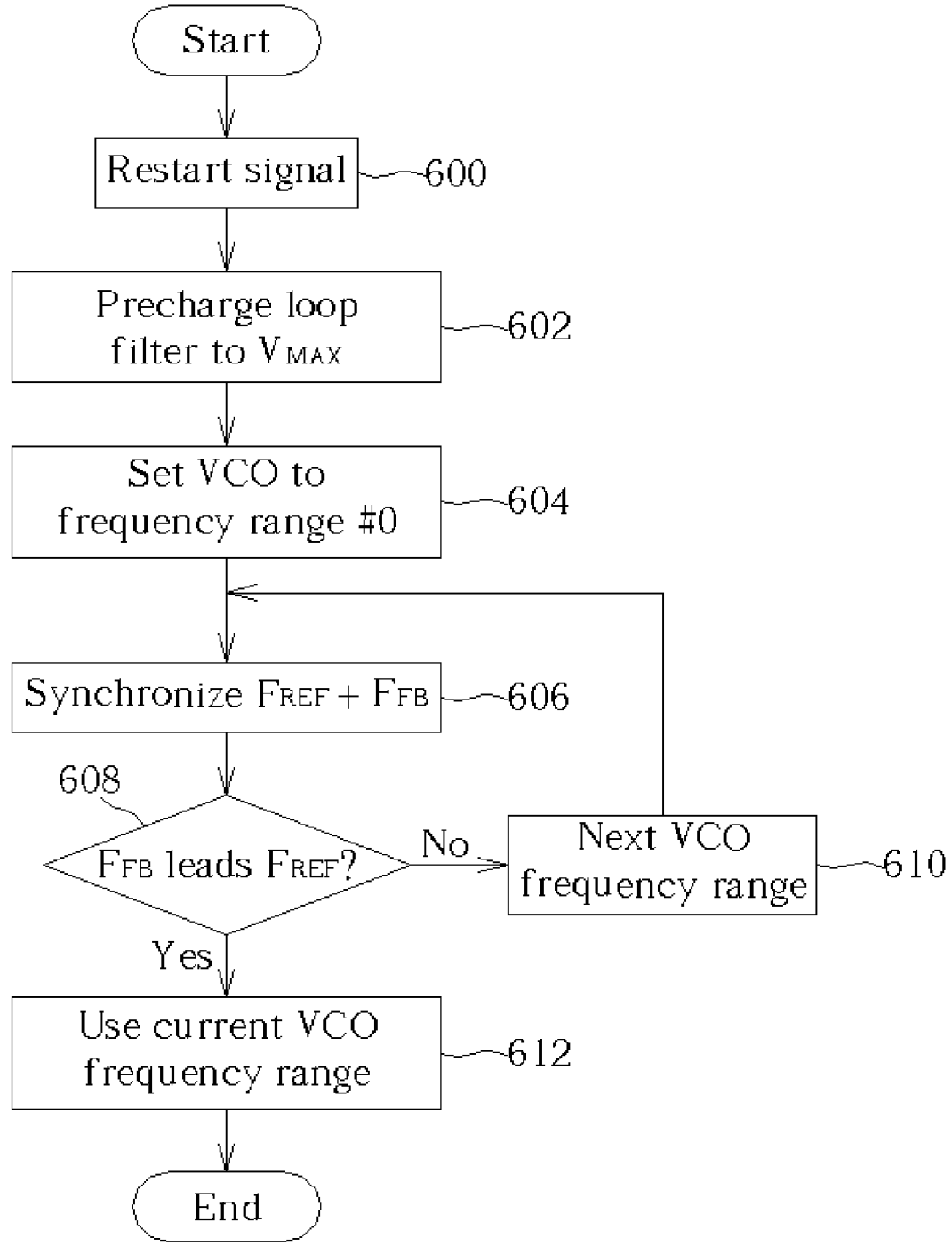
FIG. 6 is a flowchart illustrating a method of calibrating the PLL of FIG. 3 according to the first embodiment of the present invention.

FIG. 6 shows a flowchart illustrating a linear search method for automatically calibrating the PLL of FIG. 3 according to the first embodiment of the present invention. The flowchart of FIG. 6 describes searching the VCO frequency ranges starting at the lowest frequency range and finishing at the highest frequency range. The following steps are used:

Step 600: After powering on the PLL, assert the Restart signal to initiate self-calibration of the VCO frequency range. Proceed to step 602.

Step 602: Pre-charge the loop filter to a maximum voltage and proceed to step 604.

Step 604: Set the VCO frequency range to the minimum frequency range and proceed to step 606.

Step 606: Synchronize the feedback signal $FB_F$ to the reference signal $F_{REF}$ and proceed to step 608.

Step 608: Does the second rising edge of the feedback signal FFB lead the second rising edge of the reference signal FREF? If yes, the target VCO frequency is within the current frequency range so proceed to step 612. Otherwise, proceed to step 610.

Step 610: Set the VCO to the next higher VCO range and proceed to step 606.

Step 612: Use the current VCO frequency range and end self-calibration.

As described above, the first embodiment of the present invention conducts a linear search to self-calibrate the VCO frequency range using a simple process. However, there are some situations where the frequency range selected by the VCO controller 318, although correct and usable, could be further optimized. For example, because it is common that VCO frequency ranges overlap with each other. There could be two VCO frequency ranges that include the target VCO frequency. With the addition of a few complexities in the implementation of the PLL 300, the optimal VCO frequency range can be determined during self-calibration.

Figure 7:
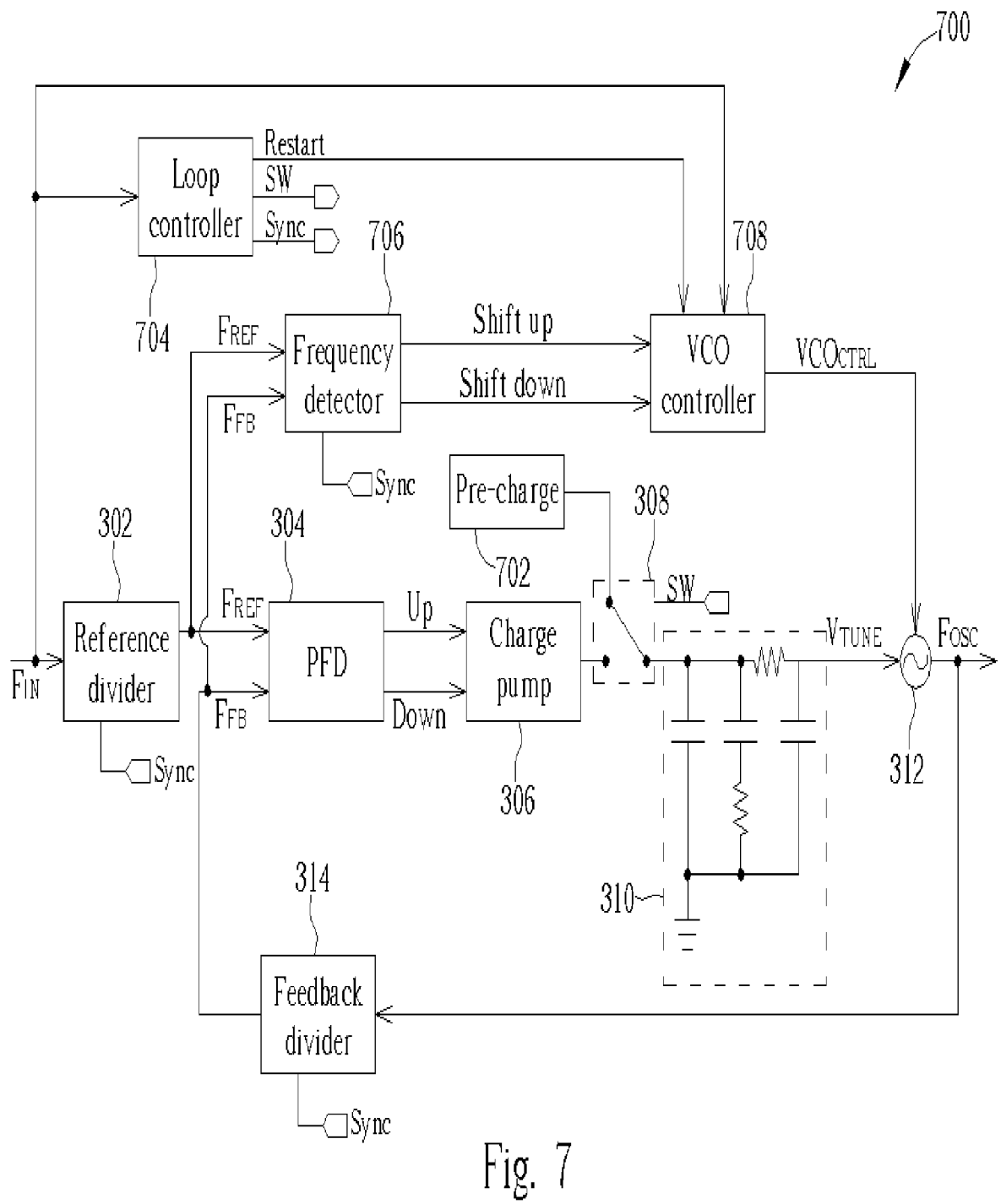
FIG. 7 is a block diagram of a PLL according to a second embodiment of the present invention.

FIG. 7 is a block diagram of a PLL 700 according to a second embodiment of the present invention. The PLL 700 includes several blocks similar with the PLL 300 shown in FIG. 3. The blocks having the exact same function as previously described for FIG. 3 are labeled with the same numerical label as in FIG. 3, while blocks having a slightly altered functionality have new numerical labels. The PLL 700 includes the reference divider 302, the phase/frequency detector (PFD) 304, the charge pump 306, the switch 308, the loop filter 310, the voltage controlled oscillator 312, the feedback divider 314, a pre-charge unit 702, a loop controller 704, a frequency detector 706, and a VCO controller 708. As with the first embodiment shown in FIG. 3, during normal PLL operations, the switch 308 connects the output of the charge pump 702 to the loop filter 310, allowing normal PLL operations. When the PLL 700 is switched on and enters automatic calibration, the PLL 700 uses a binary search to self-calibrate the VCO frequency range, preventing the need to hardwire the frequency range during manufacturing, accounting for process variations, and ensuring the PLL 700 uses the optimal VCO frequency range for a particular application.

In the second embodiment of the present invention, when starting the automatic calibration process, the pre-charge unit 702 charges the loop filter to a middle voltage value and the VCO controller 708 sets the VCO to the middle frequency range and initializes an iteration counter j to 1. The frequency detector 706 compares the reference signal $F_{REF}$ with the feedback signal $F_{FB}$. If the second rising edge of the reference signal $F_{REF}$ leads the second rising edge of feedback signal $F_{FB}$, then the frequency detector 316 asserts "Shift Up" for the time duration between the two edges. When the VCO controller 318 receives the "Shift Up" signal, this means the feedback signal is too slow and the VCO controller 318 increases the VCO frequency range by (number of ranges)/$2^{j+1}$, where j represents the iteration count. Alternatively, if the second rising edge of the reference signal $F_{REF}$ lags the second rising edge of feedback signal $F_{FB}$, then the frequency 316 asserts "Shift Down" for the time duration between the two edges. When the VCO controller 318 receives the "Shift Down" signal, this means the feedback signal is too fast and the VCO controller 318 decreases the VCO frequency range by (number of ranges)/$2^{j+1}$, where j represents the iteration count. When two adjacent frequency ranges are found, where one is too fast, and one is too slow, because of the overlap between the two frequency ranges, both frequency ranges include the target frequency and either one can be used. By using this binary search algorithm, the loop controller 704 can reduce the number of Sync signals sent and the PLL can automatically calibrate faster. Furthermore, by selecting the frequency range having the shortest duration "Shift Up" or "Shift Down" signal, the target frequency will be positioned closer to the center of the frequency range. This is the optimal frequency range for the given PLL application.

Figure 8:
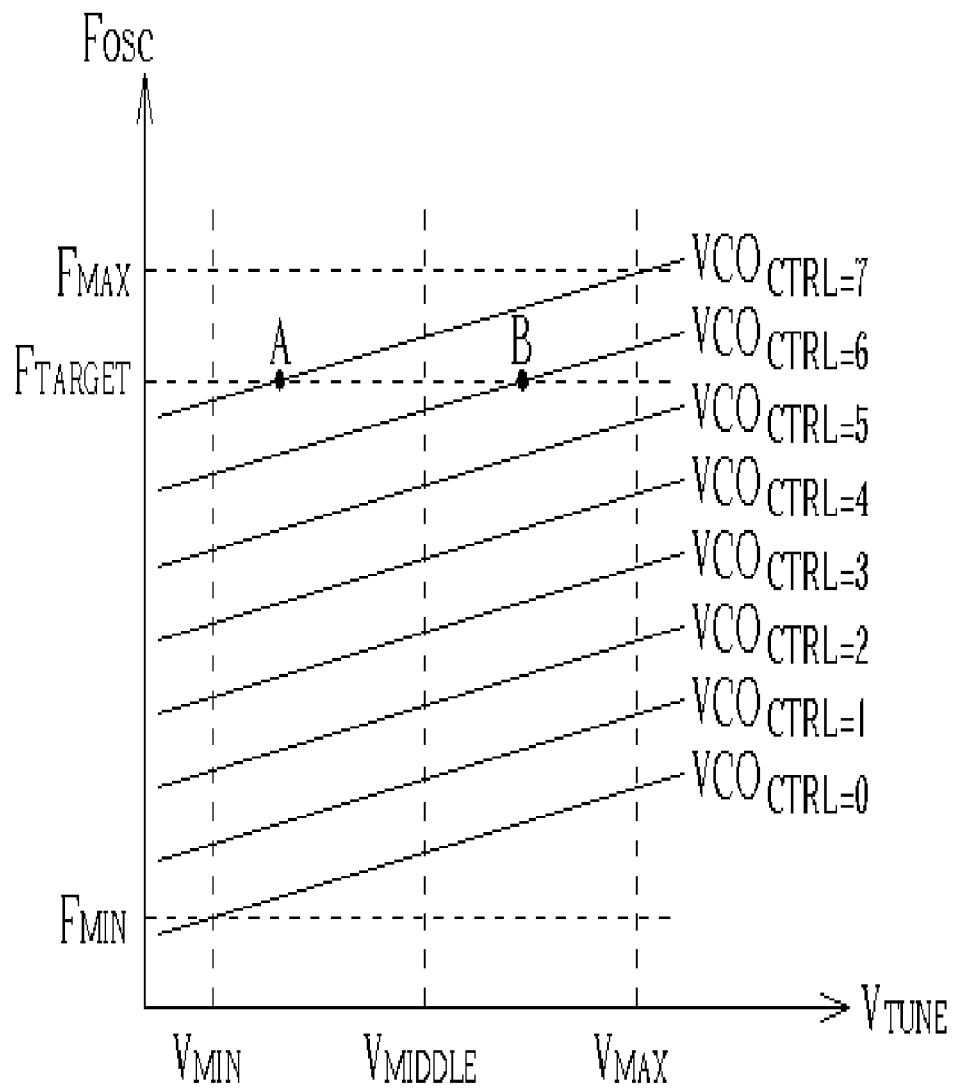
FIG. 8 is a diagram showing a hypothetical set of eight frequency ranges for the VCO of FIG. 7.

FIG. 8 shows a hypothetical set of eight frequency ranges for the VCO 312 of FIG. 7 having overlap with each other. During self-calibration, the VCO controller 708 uses the binary search previously described to find a first frequency range ($VCO_{CTRL}$=7wwslu) and a second frequency range ($VCO_{CTRL}$=6wwslu), wherein the VCO is too fast for the first frequency range and too slow for the second frequency range. It is important to note that the first frequency range and the second frequency range are adjacent to each other, i.e. there are no frequency ranges between the first frequency range and the second frequency range. The VCO controller now compares the duration of the "Shift Down" signal for the first frequency range and the "Shift Up" signal for the second frequency range. The duration of the "Shift Down" signal or the "Shift Up" signal represents the distance the target frequency is from the center of the frequency range. The frequency range where the target frequency is closest to the center (the frequency range having the shorted time duration) is selected as the optimal frequency range.

Figure 9:
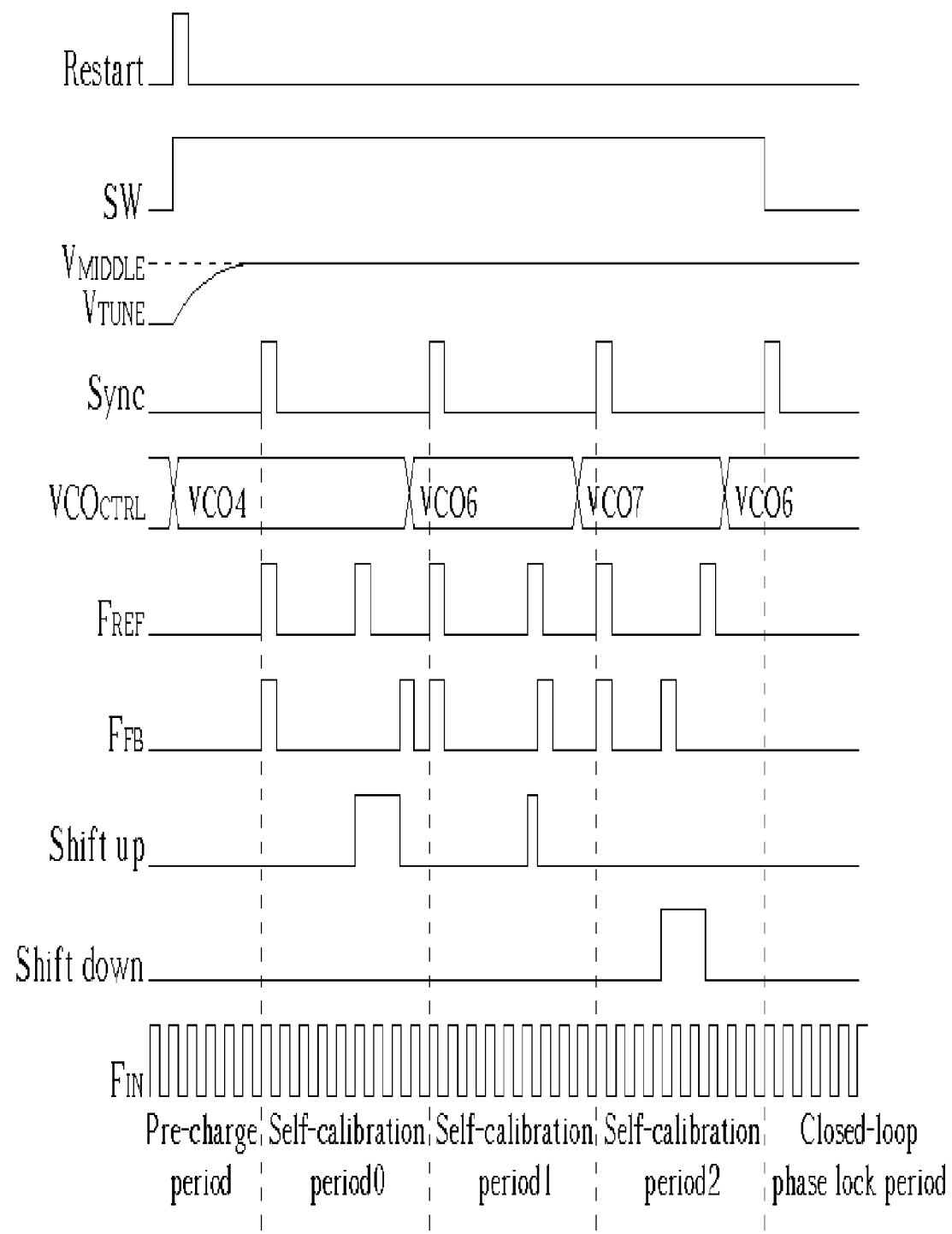
FIG. 9 is a timing diagram of the calibration signals for the PLL of FIG. 7.

FIG. 9 is a timing diagram of the signals during self-calibration for the PLL of FIG. 7 having the frequency ranges shown in FIG. 8. To begin self-calibration, the loop controller 704 asserts the Restart signal and switches the switch 308 to allow the pre-charge unit 702 to charge the loop filter 310 to a middle voltage $V_{MIDDLE}$. The VCO controller sets the VCO frequency range to the middle frequency range ($VCO_{CTRL}$=4). During the precharge period, the loop filter 310 output voltage $V_{TUNE}$ is charged to the middle value $V_{MIDDLE}$. The loop controller then asserts a Sync pulse to synchronize the first rising edges of the reference signal $F_{REF}$ and the feedback signal $F_{FB}$ and begins the first self-calibration period. Because the second rising edge of the reference signal $F_{REF}$ leads the second rising edge of feedback signal $F_{FB}$, the frequency 706 asserts "Shift Up" for the time duration between the two edges. The VCO controller sets the VCO frequency range to the seventh frequency range ($VCO_{CTRL}$=6). The loop controller 704 then asserts another Sync pulse to start the second self-calibration period. Although the frequency of the feedback signal has been increased, the second rising edge of the reference signal $F_{REF}$ still leads the second rising edge of feedback signal $F_{FB}$. The frequency 706 asserts "Shift Up" for the time duration between the two edges, and the VCO controller sets the VCO frequency range to the eighth frequency range ($VCO_{CTRL}$=7). The loop controller 704 then asserts the last Sync pulse to finish the self-calibration period. The frequency of the feedback signal $F_{FB}$ is now greater than the frequency of the reference signal $F_{REF}$. The frequency detector 706 asserts "Shift Down" for the time duration between the two edges. The VCO controller compares the duration of the "Shift Up" signal for the seventh frequency range ($VCO_{CTRL}$=6) and the duration of the "Shift Down" signal for the eighth frequency range ($VCO_{CTRL}$=7). The duration of the "Shift Up" signal for the seventh frequency range ($VCO_{CTRL}$=6) is shorter, which means that the target VCO frequency is closer to the middle of the seventh frequency range ($VCO_{CTRL}$=6). This can be seen in FIG. 8 by the point B for the seventh frequency range ($VCO_{CTRL}$=6) being closer to the center $V_{MIDDLE}$ than point A for the eighth frequency range ($VCO_{CTRL}$=7). Therefore, the VCO controller returns the VCO 312 to the seventh frequency range (VCO$_{CTRL}$=6), the loop controller switches the switch 308 to the closed-loop position, and self-calibration is complete.

Figure 10:
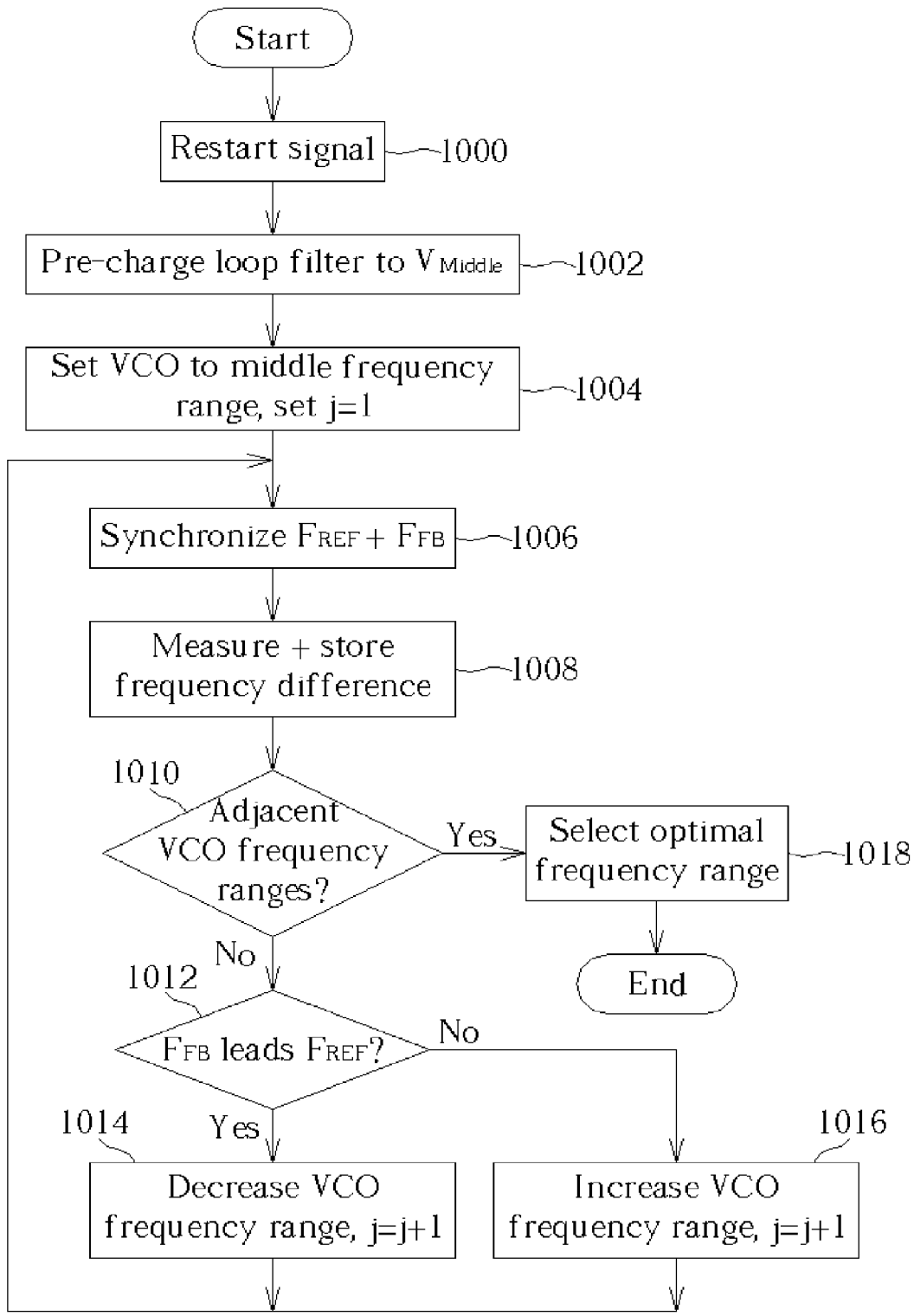
FIG. 10 shows a flowchart illustrating a method for determining the optimal VCO frequency range when automatically calibrating the PLL of FIG. 7 according to the second embodiment of the present invention.

FIG. 10 shows a flowchart illustrating a method for determining the optimal VCO frequency range when automatically calibrating the PLL 700 of FIG. 7 using a binary search according to the second embodiment of the present invention. The flowchart includes the following steps:

Step 1000: After powering on the PLL, assert the Restart signal to initiate self-calibration of the VCO. Proceed to step 1002.

Step 1002: Pre-charge the loop filter to a medium voltage and proceed to step 1004.

Step 1004: Set the VCO frequency range to the middle frequency range and initialize a loop counter j to a value of 1. Proceed to step 1006.

Step 1006: Synchronize the feedback signal $F_{FB}$ to the reference signal $F_{REF}$ and proceed to step 1008.

Step 1008: Measure and store the time duration between the second rising edges of the feedback signal $F_{FB}$ and the reference signal $F_{REF}$. Proceed to step 1010.

Step 1010: Are the current frequency range and the previous iteration frequency range adjacent frequency ranges? If yes, proceed to step 1018 to determine which of the two frequency ranges is the optimal VCO frequency range, otherwise, proceed to step 1012. If this is the first iteration (j=1) and there is no previous iteration frequency range, directly proceed to step 1012.

Step 1012: Does the second rising edge of the feedback signal $F_{FB}$ lead the second rising edge of the reference signal $F_{REF}$? If yes, proceed to step 1014, otherwise, proceed to step 1016.

Step 1014: Decrease the VCO frequency range by: (total number of ranges)/$2^{j+1}$, where j is the iteration counter. The decreased VCO frequency range may need to be rounded to the nearest integer. Proceed to step 1006.

Step 1016: Increase the VCO frequency range by: (total number of ranges)/$2^{j+1}$ where j is the iteration counter. The increased VCO frequency range may need to be rounded to the nearest integer. Proceed to step 1006.

Step 1018: Select the optimal frequency range. If the time duration stored in step 1008 for the current iteration is shorter than the time duration stored in step 1008 for the previous iteration, the optimal frequency range is the current frequency range. Otherwise the optimal frequency range is the frequency range of the previous iteration. Set the VCO to the optimal frequency range and self-calibration is complete.

Figure 11:
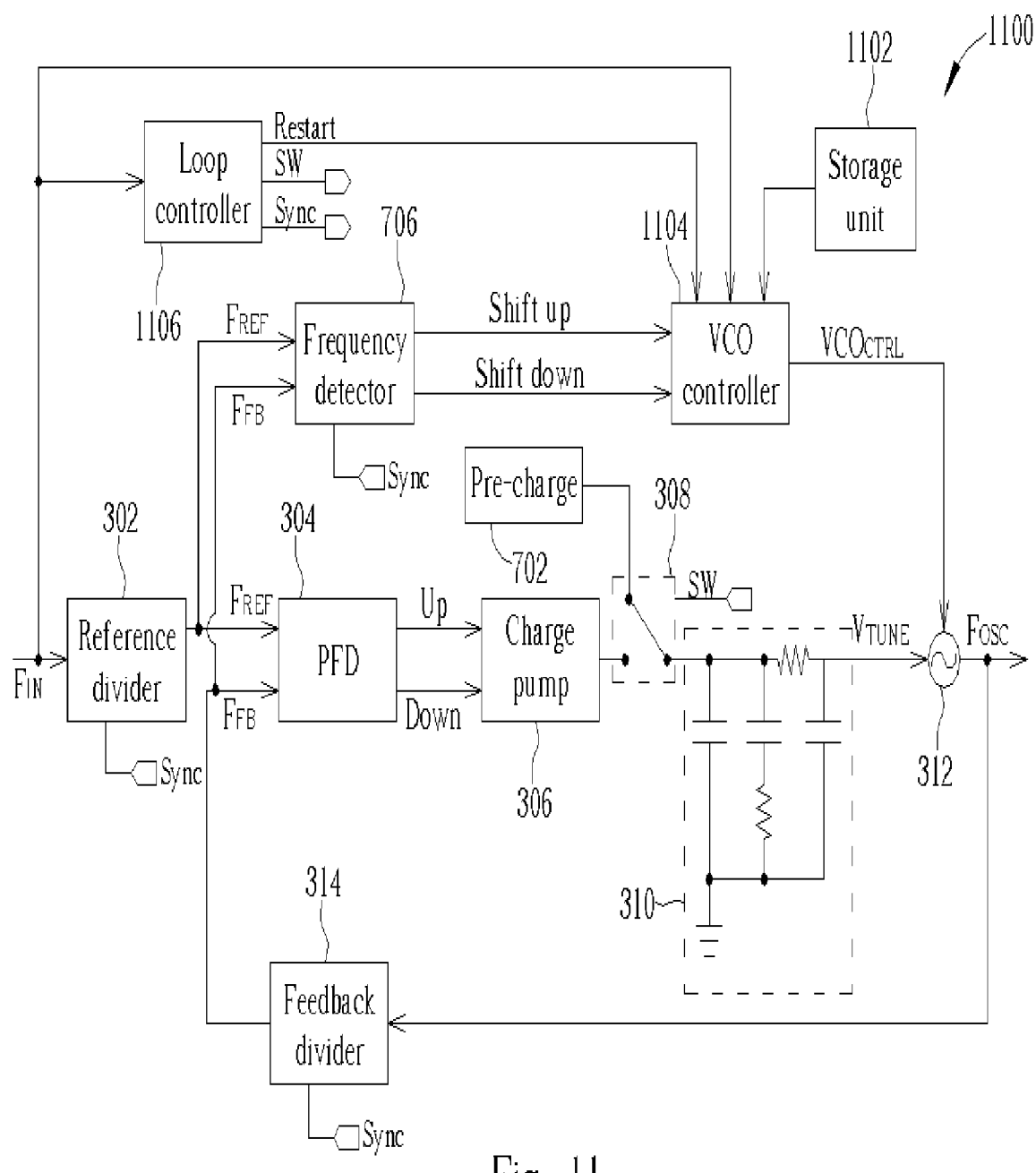
FIG. 11 is a block diagram of a PLL according to a third embodiment of the present invention.

FIG. 11 is a block diagram of a PLL 1100 according to a third embodiment of the present invention. The third embodiment is very similar to the second embodiment described in FIG. 7 with the addition of a storage unit 1102 connected to a VCO controller 1104 having a slightly modified function. Additionally, a loop controller 1106 is used that only provides two calibration Sync signals. Upon receiving the Restart signal, the VCO controller 1104 checks the divide factor setting of the feedback divider 314 and searches the storage unit 1102 for a predicted VCO frequency range. The storage unit 1102 includes a plurality of different divide factor settings for the feedback divider 314 and for each divide factor setting the storage unit 1102 includes a corresponding mapping to a predicted VCO frequency range. The VCO controller 1104 searches the storage unit 1102 and sets the VCO frequency range to the predicted VCO frequency range found in the storage unit 1102. The loop controller then asserts the first Sync pulse to synchronize the first rising edges of the reference signal $F_{REF}$ and the feedback signal $F_{FB}$. If the second rising edge of the reference signal $F_{REF}$ leads the second rising edge of feedback signal $F_{FB}$, the frequency 706 asserts "Shift Up" for the time duration between the two edges. The VCO controller measures and stores a first duration of the "Shift Up" signal or the "Shift Down" signal and increases or decreases the VCO frequency range to the adjacent frequency range according to whether the "Shift Up" or "Shift Down" signal is received, respectively. The loop controller then asserts the second Sync pulse to synchronize the first rising edges of the reference signal $F_{REF}$ and the feedback signal $F_{FB}$ for the new frequency range. The VCO controller 1104 measures a second duration of the "Shift Up" signal or the "Shift Down" signal. If the second duration is shorter than the first duration, the optimal frequency range is the current frequency range. Otherwise the optimal frequency range is the predicted VCO frequency range tested previously. The VCO controller 1104 sets the VCO to the optimal frequency range and self-calibration is complete.

Figure 12:
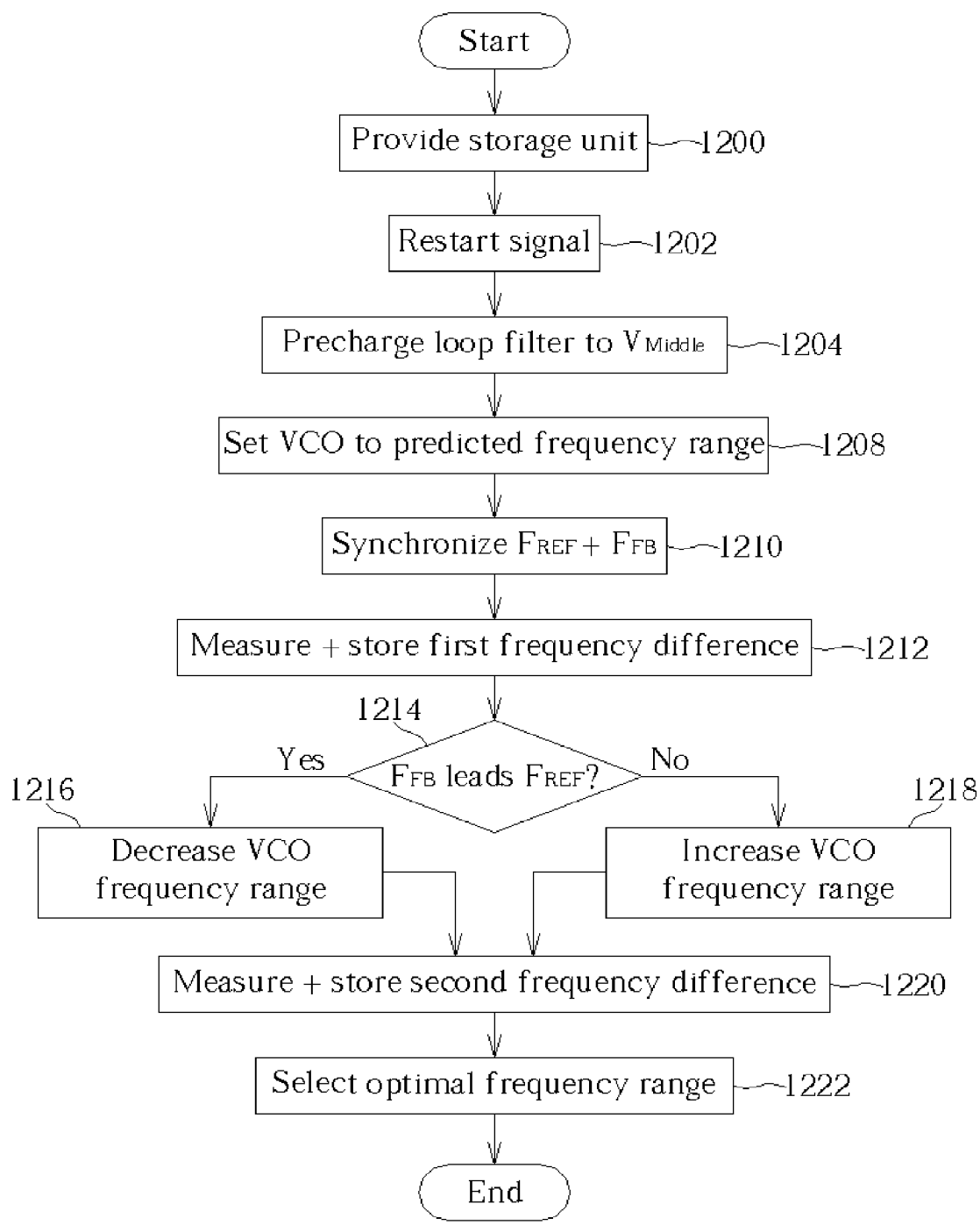
FIG. 12 is flowchart illustrating a method of calibrating the PLL of FIG. 12 according to the third embodiment of the present invention.

FIG. 12 is a flowchart illustrating a method for automatically calibrating the PLL 1100 of FIG. 11 with the optimal VCO frequency range according to the third embodiment of the present invention. The third embodiment involves searching a storage unit for a predicted VCO frequency range and includes the following steps:

Step 1200: Provide a storage unit for storing mappings relating divide factor settings for the feedback divider to predicted VCO frequency ranges. Proceed to step 1202.

Step 1202: After powering on the PLL, assert the Restart signal to initiate self-calibration of the VCO frequency range. Proceed to step 1204.

Step 1204: Pre-charge the loop filter to a middle voltage and proceed to step 1208.

Step 1208: According to the divide factor setting of the feedback divider, search the storage unit provided in step 1200 to determine a predicted VCO frequency range. Set the VCO frequency range to the predicted VCO frequency range and proceed to step 1210.

Step 1210: Synchronize the feedback signal $F_{FB}$ to the reference signal $F_{REF}$ and proceed to step 1212.

Step 1212: Measure and store a first time duration being the duration between the second rising edges of the feedback signal $F_{FB}$ and the reference signal $F_{REF}$. Proceed to step 1214.

Step 1214: Does the second rising edge of the feedback signal $F_{FB}$ lead the second rising edge of the reference signal $F_{REF}$? If yes, proceed to step 1216, otherwise, proceed to step 1218.

Step 1216: Decrement the VCO frequency range by one and proceed to step 1220.

Step 1218: Increment the VCO frequency range by one and proceed to step

Step 1220: Measure and store a second time duration being the duration between the second rising edges of the feedback signal $F_{FB}$ and the reference signal $F_{REF}$. Proceed to step 1214.

Step 1222: Select the optimal frequency range. If the time duration stored in step 1220 for the current VCO frequency range is shorter than the time duration stored in step 121wwslu2 for the predicted VCO frequency range, the optimal frequency range is the current frequency range. Otherwise the optimal frequency range is the predicted VCO frequency range determined in step 1208. Set the VCO to the optimal frequency range and self-calibration is complete.

In contrast to the prior art, the present invention automatically calibrates the VCO frequency range, preventing the need to hardwire the frequency range during manufacturing, accounting for process variations, and allowing a PLL according to the present invention to be used in a variety of different applications. By synchronizing the feedback signal $F_{FB}$ to the reference signal $F_{REF}$ for a plurality of frequency ranges and using either a linear or binary search algorithm, a VCO frequency range including a nominal VCO target frequency can be found. By comparing the duration between the second rising edges of the feedback signal $F_{FB}$ and the reference signal $F_{REF}$ for frequency ranges including the nominal VCO target frequency, the optimal frequency range having a nominal VCO target frequency closest to the middle of the frequency range can be found.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A method for automatically calibrating the frequency range of a phase lock loop (PLL), the method comprising:
   providing a loop filter for accumulating charge to generate a loop-filter voltage;
   providing a voltage controlled oscillator (VCO) having a plurality of frequency ranges, the VCO receiving the loop-filter voltage and generating an output signal having a frequency according to the loop-filter voltage and a currently selected VCO frequency range;
   connecting an input of the loop filter to a constant voltage; and
   selecting an optimal VCO frequency range by comparing the frequency of a PLL feedback signal for a plurality of the VCO frequency ranges with the frequency of a reference signal, the PLL feedback signal being generated according to the VCO output signal;
   wherein the optimal VCO frequency range comprises either a first VCO frequency range or an adjacent second VCO frequency range such that the frequency of the PLL feedback signal is faster than the frequency of the reference signal for the first VCO frequency range and the frequency of the PLL feedback signal is slower than the frequency of the reference signal for the second VCO frequency range;
   selecting the optimal VCO frequency range further comprises synchronizing the PLL feedback signal with the reference signal;
   the input of the loop filter is connected to the medium voltage and selecting the optimal VCO frequency range further comprises conducting a binary search starting from a middle VCO frequency range and proceeding until the optimal VCO frequency range is found; and
   the optimal VCO frequency range comprises the first VCO frequency range when the time duration between the second rising edges of the reference signal and the PLL feedback signal for the first VCO frequency range is shorter than that of the second VCO frequency range, otherwise comprises the second VCO frequency range when the time duration between the second rising edges of the reference signal and the PLL feedback signal for the second VCO frequency range is shorter than that of the first VCO frequency range.

2. The method of claim 1, further comprising providing a feedback divider for generating the PLL feedback signal according to the VCO output signal.

3. The method of claim 1, wherein the input of the loop filter is connected to a maximum voltage or a minimum voltage and selecting the optimal VCO frequency range further comprises conducting a linear search starting from a lowest or a highest VCO frequency range and proceeding until the optimal VCO frequency range is found.

4. The method of claim 1, wherein finding the first VCO frequency range comprises mapping a divide factor of a feedback divider to a predicted first VCO frequency range.

5. A phase lock loop (PLL) comprising:
   a loop filter for accumulating charge to generate a loop-filter voltage;
   a VCO having a plurality of frequency ranges, the VCO receiving the loop-filter voltage and generating an output signal having a frequency according to the loop-filter voltage and a currently selected VCO frequency range;
   calibration logic for selecting an optimal VCO frequency range, wherein during PLL calibration, the input of the loop filter is connected to a constant voltage, and the calibration logic searches for an optimal VCO frequency range by comparing the frequency of a PLL feedback signal for a plurality of the VCO frequency ranges with the frequency of a reference signal, the PLL feedback signal being generated according to the VCO output signal; and
   a feedback divider for generating the PLL feedback signal according to the VCO output signal;
   wherein the calibration logic further comprises a frequency detector receiving the PLL feedback signal and the reference signal, and wherein the optimal VCO frequency range comprises either a first VCO frequency range or an adjacent second VCO frequency range such that the frequency of the PLL feedback signal is faster than the frequency of the reference signal for the first VCO frequency range and the frequency of the PLL feedback signal is slower than the frequency of the reference signal for the second VCO frequency range;
   the calibration logic further comprises a loop controller and during PLL calibration, when searching for the optimal VCO frequency range, the loop controller sends a synchronize signal to the feedback divider to synchronize the PLL feedback signal with the reference signal;
   the calibration logic further comprises a switch for selectively connecting the input of the loop filter to a middle voltage, and wherein the PLL calibration, the calibration logic conducts a binary search starting from a middle VCO frequency range and proceeding until the optimal VCO frequency range is found; and
   the optimal VCO frequency range comprises the first VCO frequency range when the time duration between the second rising edges of the reference signal and the PLL feedback signal for the first VCO frequency range is shorter than that of the second VCO frequency range, otherwise comprises the second VCO frequency range when the time duration between the first rising edges of the reference signal and the PLL feedback signal for the second VCO frequency is shorter than that of the first VCO frequency range.

6. The PLL of claim 5, wherein the calibration logic further comprises a switch for selectively connecting the input of the loop filter to a maximum voltage or a minimum voltage depending on a control signal from the loop controller, and wherein during PLL calibration, the calibration logic conducts a linear search starting from a lowest VCO frequency range and proceeding until the optimal VCO frequency range is found.

7. The PLL of claim 5, wherein the calibration logic further comprises:
   a storage unit storing a plurality of predicted first VCO frequency ranges indexed by divide factors for the feedback divider;

wherein during PLL calibration, the calibration logic determines the first VCO operating frequency range according to the predicted first VCO frequency range retrieved from the storage unit according to the divide factor of the feedback divider.

* * * * *